United States Patent [19]

Donges et al.

[11] Patent Number: 5,188,669

[45] Date of Patent: Feb. 23, 1993

[54] CIRCUIT BOARD COATING APPARATUS WITH INVERTING PALLET SHUTTLE

[75] Inventors: William E. Donges, Wellington, Ohio; Jacques Mycke, Mettmann, Fed. Rep. of Germany

[73] Assignee: Nordson Corporation, Westlake, Ohio

[21] Appl. No.: 659,855

[22] Filed: Feb. 22, 1991

[51] Int. Cl.$^5$ .............................................. B05C 13/00
[52] U.S. Cl. ................................... 118/503; 118/300; 118/320; 118/731
[58] Field of Search ............... 118/500, 503, 630, 634, 118/731, 300, 320

[56] References Cited

U.S. PATENT DOCUMENTS

| | | | |
|---|---|---|---|
| 3,662,708 | 5/1972 | Shrader | 118/500 X |
| 4,674,621 | 6/1987 | Takahashi | 118/503 X |
| 4,867,099 | 9/1989 | Heine et al. | 118/503 X |
| 4,871,584 | 10/1989 | Weber | 118/503 X |
| 4,900,580 | 2/1990 | Grah et al. | 427/33 |

*Primary Examiner*—Michael G. Wityshyn
*Attorney, Agent, or Firm*—Wood, Herron & Evans

[57] ABSTRACT

A coating apparatus has one coating station with a downwardly directed device to coat both opposite surfaces of two sided circuit boards. One upwardly facing surface of a first board is coated at the coating station and moved to a handling station while a second board is moved to the coating station where its upwardly facing surface is coated while the first board is inverted at the handling station. The first board is then moved to the coating station while the second board is removed to a handling station, and the opposite side of the first board is coated at the coating station while the second board is inverted at the handling station. The two boards are exchanged in the coating station and then the opposite side of the second board is coated there while the first board is exchanged with a third board at the handling station. Two handling stations are preferred, equally spaced from the coating station, with two boards are simultaneously carried by a shuttle in two invertible pallets spaced on the shuttle a fixed distance equal to that of the coating station from the handling stations. Couplings at the ends of the shuttle engage pallet rotating drives as a pallet moves into the handling station.

20 Claims, 5 Drawing Sheets

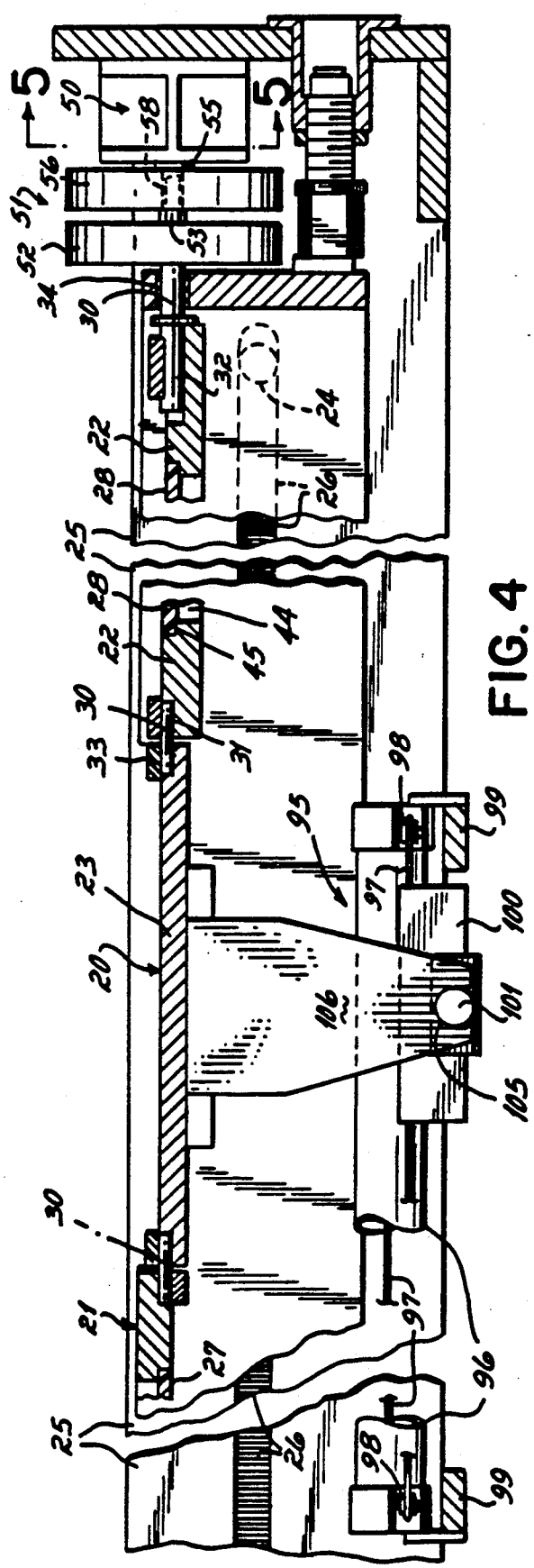
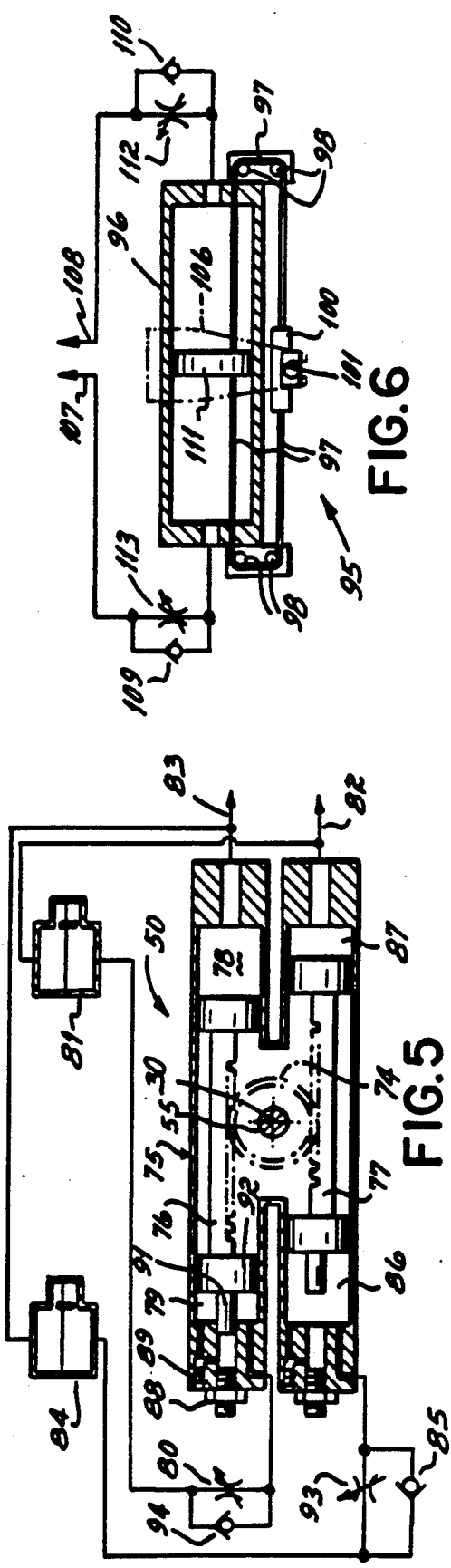
FIG. 4
FIG. 6
FIG. 5

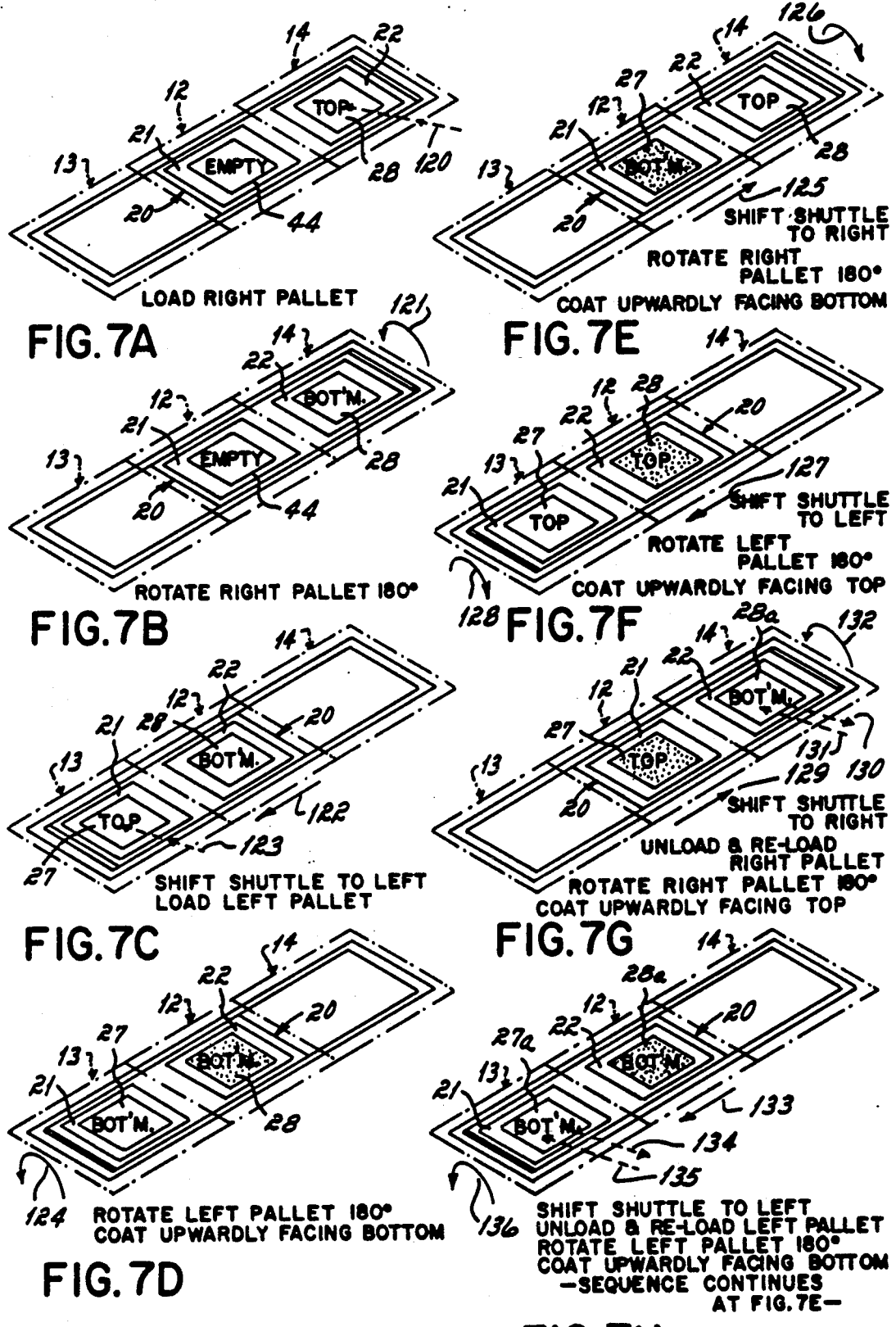

CIRCUIT BOARD COATING APPARATUS WITH INVERTING PALLET SHUTTLE

The present invention relates to the application of coatings to circuit boards, and more particularly, to the application of coating materials onto the surfaces of both of the sides of two-sided circuit boards.

BACKGROUND OF THE INVENTION

In the application of coatings, particularly liquid coatings, to circuit boards, efforts have been made in the prior art to achieve a more efficient coating apparatus and to provide a faster method of application of the coating material. Where application of a coating to the surfaces of both sides of two sided circuit boards is required, however, the optimization of the apparatus and of the method of applying the coatings to the two opposite surfaces of circuit boards have not been optimal.

One method and apparatus of the prior art is illustrated and described in U.S. Pat. No. 4,867,099, which discloses a coating apparatus having one applicator gun positioned beneath the circuit board to coat the bottom surface of the board at one coating station and a second applicator gun positioned above the board to coat the top surface of the board at a subsequent coating station to which the board is routed after being coated at the first coating station. With such an apparatus, circuit boards are continuously conveyed in a single direction sequentially through the two coating stations at which the two opposite sides of the circuit board are sequentially coated and then conveyed to an oven where the coating is dried. To convey the boards through this apparatus, the boards are loaded onto a conveyor upstream of the first coating station and removed from the conveyor downstream of the oven while being maintained in the same orientation as they are being conveyed through the two coating stations. With many circuit board coating materials, however, application of the coatings from below is less desirable, and less effective and efficient, than where such coatings, particularly liquid coatings, are applied from above.

Another approach taken by the prior art is set forth in U.S. Pat. No. 4,900,580, which also discloses a system having two coating stations spaced along a conveyor. With this approach, an applicator gun positioned overhead in each coating station and the circuit boards are loaded onto the conveyor upstream of the first coating station. The circuit boards are then conveyed through the first coating station where coating material is applied downwardly from above upon the upwardly facing surface of each board. Each circuit board, with one of its surfaces coated and facing upwardly, is then conveyed to an inversion station located between the two coating stations at which the board is inverted to bring its formerly downwardly facing uncoated surface into an upwardly facing orientation so that it too may also be coated from above at the second coating station. By inverting the circuit boards between the two coating stations, the necessity of applying a coating material to the circuit board from below, sometimes undesirable, is avoided.

Another approach taken by the prior art is disclosed in U.S. Pat. No. 4,871,584. In this approach, the necessity of providing two coating stations is eliminated by a method of conveying a circuit board through a single coating station in one direction where the upwardly facing side is coated, then inverting the board and conveying it back through the same coating station in the reverse direction to coat the upwardly facing surface on the opposite side of the board. This too eliminates the necessity of coating the board from below and does so with only one coating station. A disadvantage of this approach is that the single coating station provided is idle during the time it takes each board to be removed from the coating station after the first side has been coated, inverted, and returned to the coating station for the coating of the second side. This sacrifices production efficiency to save one coating station and one coating dispensing device.

Accordingly, there is a need to provide a method and apparatus that requires only a single coating station, allows that coating station to apply coating material, particularly a liquid coating material, to circuit boards from only one side thereof, preferably from above, and which coats both sides of the printed circuit board without leaving the coating station idle during the time it takes to invert the circuit board to bring its opposite side to an orientation which faces upwardly to receive the material applied from the overhead coating device.

SUMMARY OF THE INVENTION

According to the principles of the present invention, there is provided a method and apparatus for coating printed circuit boards, particularly for applying spray coatings to printed circuit boards, which utilizes a single coating station with, in the preferred embodiment, a single coating applicator, preferably positioned and oriented to apply coating material downwardly to the board from above. The apparatus is provided with a single coating station and at least one handling station. A plurality of pallets, preferably two in number, are provided, which each hold a different circuit board.

The pallets are moved so that one is positioned in the coating station for coating to be applied to one surface of the board held thereby, during the time that a second pallet, located at a handling station, is being loaded, unloaded and/or rotated through 180° to invert the circuit board that it holds. Then the pallet from the handling station is moved to the coating station while a second pallet, which holds a board coated on one side, is moved from the coating station to a handling station. While one surface of the board held on the second pallet is being coated at the coating station, the board on the first pallet is inverted at the handling station. Then, the board on the first pallet is moved to the coating station while the board on the second pallet is moved to a handling station. At the coating station, the second side of the board on the first pallet is also coated, while the boards on other pallets at the handling stations are inverted on, loaded onto and/or unloaded from, the pallets.

According to the preferred method of the present invention, one pallet is loaded at a handling station while another pallet is empty and located at the coating station. Then the loaded pallet is moved to the coating station for coating to be applied to one surface of the board held thereon while the empty pallet from the coating station is moved to a handling station for loading with a circuit board. The pallets are then moved to bring an uncoated circuit board loaded on a pallet at the handling station to the coating station for coating of one of its sides, while a partially coated circuit board is moved to a handling station. At the handling station, the partially coated board is inverted by 180° rotation of the pallet while the other circuit board at the coating station is being coated on one of its sides. Then the inverted circuit board from the handling station is brought back to the coating station with its coated surface facing away from the coating applicator for application of a coating to its second or opposite surface, while the other circuit board from the coating station, with one side coated, is moved to a handling station where it is inverted by 180° rotation of the pallet to which it is held. This inversion also takes place while the coating is being applied on the other board at the coating station. Then the shuttle is moved so that the circuit board that was last inverted is moved to the coating station with its uncoated surface facing the coating applicator where it is coated while the other circuit board from the coating station, having been simultaneously moved to a handling station with both sides thereof coated, is removed from its pallet and replaced with an uncoated circuit board. This new uncoated board is then moved to the coating station while the fully coated board on the pallet at the coating station is moved to a handling station where it too is removed and replaced with an uncoated circuit board. The method of operation continues allowing all loading and unloading and inversion of the circuit boards to be carried out at one or more handling stations while a single fully utilized coating station can operate without being idle to coat circuit board sides one at a time, thereby coating both sides of the circuit boards, preferably with a single coating applicator positioned on one side, preferably above, the pallets.

In its preferred embodiment, each pallet holds a single circuit board, which is coated with material applied from a single applicator device at the coating station. The pallets may, alternatively, hold a plurality of circuit boards, and a plurality of applicator devices, or devices having a plurality of nozzles, for example, may be employed at the coating station.

According to the preferred embodiment of the present invention, two pallets are carried on a movable shuttle and spaced thereon a distance equal to the spacing of the coating station from a handling station. Preferably, two handling stations are provided, one on each side of the coating station and arranged in a line. The shuttle is reciprocated, between two positions on a linear track that extends through the three stations. When moved to one of the positions, the shuttle brings one pallet to the coating station while the other pallet is at one of the handling stations. When moved to the second of the positions, the shuttle brings the pallet from the handling station to the coating station and the pallet from the coating station to the other of the two handling stations.

In the preferred apparatus of the present invention, two pallets are mounted on the shuttle such that each can rotate independently through 180° about a horizontal axis to invert the circuit board held thereby. The pallets each contain structure that locks a circuit board to the pallet at all positions of the shuttle except that position at which the pallet is fully positioned in a handling station, in which place the board can be unlocked from the pallet.

The pallets are also locked against rotation on the shuttle at all positions of the shuttle except that at which a pallet is fully positioned in a handling station, where the pallet is coupled with a rotation mechanism, engaged by movement of the pallet into the handling station, for selective rotation of the pallet with the rotation mechanism when the mechanism is activated. Pallet rotating mechanisms are provided at the opposite ends of the apparatus, which engage a coupling on the pallet as the shuttle advances the pallet into a handling station.

The pallet rotating mechanism is preferably a rack and gear drive, which rotates the pallet back and forth to two 180° spaced angular orientations to alternately bring the top and bottom sides of the circuit board held thereby into an upwardly facing orientation. When a pallet is fully located in a handling station, a locking clip is accessible to an operator. The clip pivots to either hold the board into a holder on the pallet, or to lock the pallet against rotation on the shuttle while releasing the circuit board so that boards may be inserted into and removed from the pallet.

A linear actuator preferably drives the shuttle between the two extreme shuttle positions to alternately bring the pallets to their respective handling stations while the other pallet is carried to the coating station. The linear actuator also moves the shuttle into the handling stations to bring a coupling element on the outer end of the pallet into engagement with the pallet rotating drive mechanism.

A door enclosure covers each of the handling stations in the preferred embodiment. A latching control latches the pallet in the handling station against rotation on the shuttle whenever the door is open.

The present invention provides the advantages of a single overhead spray coating station having one or more applicators that coat both sides of a circuit board without the coating station being idle when the boards are being inverted. One or more, and preferably two, handling stations are provided so that circuit boards can be loaded to, unloaded from, and inverted on, any one of at least two pallets while a coating operation is being performed on a circuit board held by a pallet in the coating station.

These and other objectives and advantages of the present invention will be more readily apparent from the following detailed description of the drawings, in which:

BRIEF DESCRIPTION OF THE DRAWINGS

FIG. 4 is a front cross-sectional view taken along line 4—4 of FIG. 2A.

FIG. 5 is a side cross-sectional view taken along line 5—5 of FIG. 4.

FIG. 6 is a schematic view of a shuttle drive mechanism as depicted in FIG. 4.

FIGS. 7A-7H are a series of perspective illustrations of the steps in the operating sequence of the shuttle portion of the apparatus in FIG. 2, with its position in FIG. 2 being that shown in FIG. 7E.

DETAILED DESCRIPTION OF THE DRAWINGS

Figure 1:
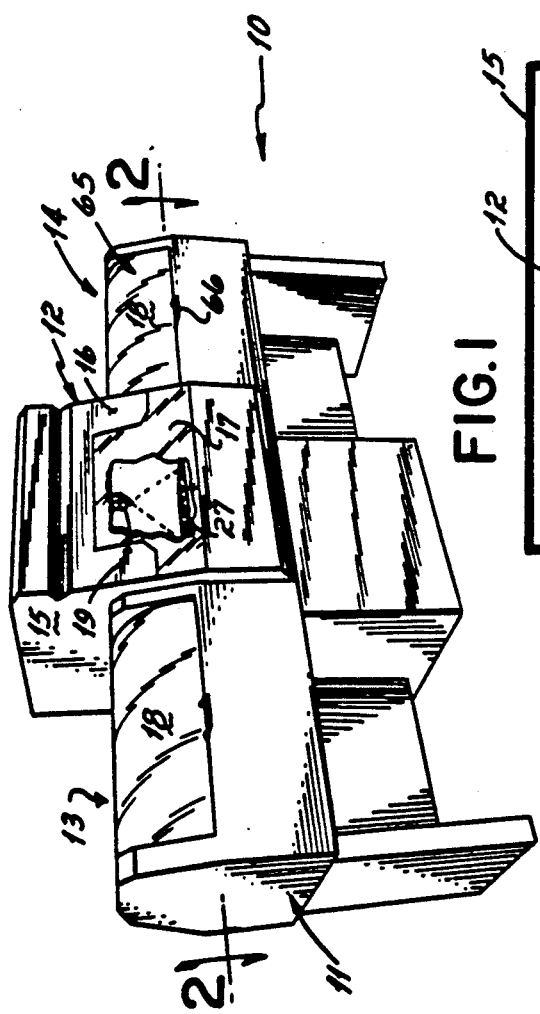
FIG. 1 is a perspective view, partially broken away, of a coating apparatus according to one preferred embodiment of the present invention.

Referring to FIG. 1, a coating apparatus 10 according to one preferred embodiment of the present invention is illustrated. The apparatus 10 includes a stationary housing or frame 11 having supported at its center a circuit board spray coating station 12. Spaced on opposite sides of the coating station 12 and mounted in line with it at the top of the frame 11 are two circuit board handling stations 13 and 14, including a left handling station 13 to the left of the coating station 12 and a right handling station 14 to the right of the coating station 12.

The coating station 12 is in the form of a closed coating chamber covered by a coating chamber hood or cabinet 15. At the front of the cabinet 15 is an operator access door 16 shown in a closed position. The coating chamber access door 16 has a transparent window 17 to allow an operator to monitor from the front of the apparatus 10 the coating process being carried on at the coating station 12. The door 16 is opened for change-over and maintenance operations, but is otherwise closed during sequential coating of a plurality of circuit boards at the coating station 12. The processes carried out at the coating station 12 may include any one of a number of coating processes such as an application of photo-resist coating or of moisture-resistant or other protective coatings to the surfaces of circuit boards in their manufacture.

The handling stations 13 and 14 may be provided in any number, but preferably two are provided. Both of the handling stations 13 and 14 are, in this embodiment, spaced the same distance from the coating station 12, in a line on opposite sides of the coating station 12. The handling stations 13 and 14 are identical except that they are mirror images of each other. The handling stations 13 and 14 are provided for the loading and unloading of circuit boards to and from the apparatus 10, and for the inversion, or the turning over, of circuit boards between the application of coatings to their opposite sides.

Each of the handling stations 13 and 14 is provided with a transparent operator access door 18 at its front for the loading and unloading of circuit boards into and from the apparatus 10.

By providing one or more handling stations, such as the stations 13 and 14, the loading and unloading of printed circuit boards into and from the apparatus 10, and the inversion of the circuit boards between the coating of their opposite sides, the loading, unloading and inversion of circuit boards can be carried out while another circuit board is being coated at the coating station 12. This avoids the inefficient use of the coating station 12 that results if the coating station 12 remains idle while the board is being inverted or otherwise handled. In addition, the provision for inversion of the circuit boards at the handling stations 13 and 14 not only allows for inversion of the boards to take place without idle time at the coating station 12, but also allows, in the preferred embodiment, for the use of a single side coating dispensing device at the coating station 12, which is preferably positioned to dispense coating material downwardly onto the circuit boards from above, as, for example, the dispensing device 19 shown at the coating chamber 12 of FIG. 1. Such devices are disclosed in U.S. Pat. Nos. 4,753,819 and 4,880,663, and in the copending commonly assigned U.S. patent Ser. No. 07/510,001, filed Apr. 17, 1990, now U.S. Pat. No. 5,141,165, which are hereby expressly incorporated herein by reference. The coating dispensing device 19 overlies a circuit board carrying shuttle 20, which is better illustrated in the Figures described below.

Figure 2:
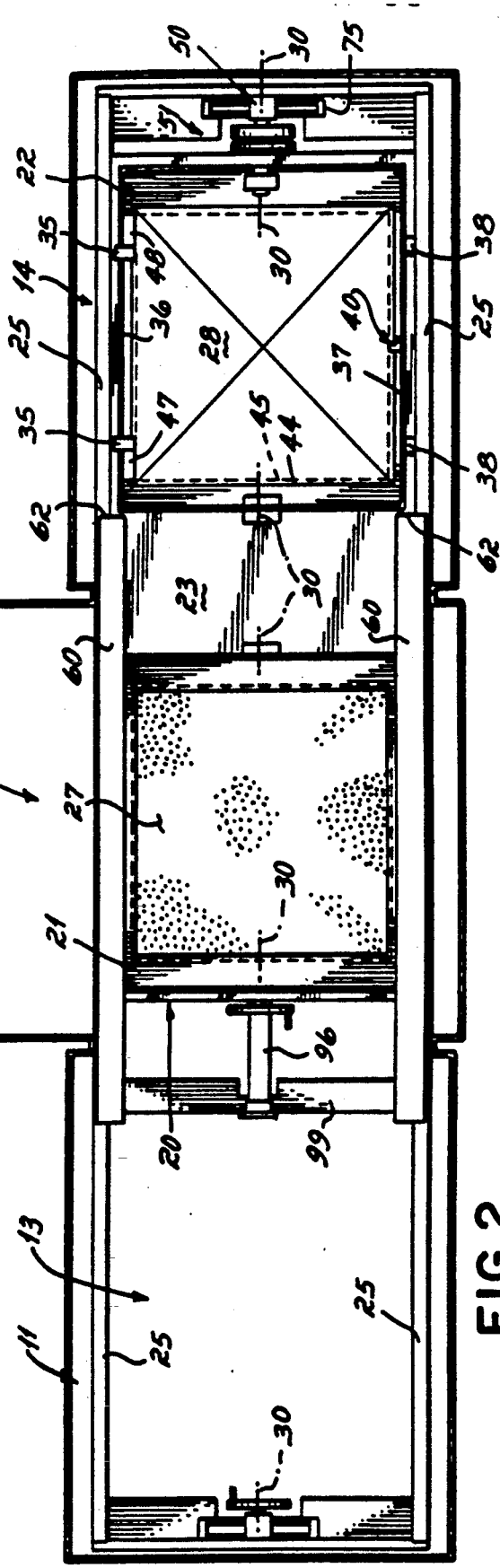
FIG. 2 is a top cross-sectional view of the coating apparatus of FIG. 1 taken along line 2—2 thereof.

Referring to FIG. 2, the shuttle 20 is provided within the apparatus 10. The shuttle 20 is a horizontally extending slidably mounted two pallet shuttle which reciprocates in a line between left and right positions. The pallet 20 has rotatably mounted thereon at least two pallets, including a left circuit board receiving and holding pallet 21 and a right circuit board receiving and holding pallet 22. The left pallet 21 is provided to transport circuit boards between the left handling station 13 and the processing station 12, while the right pallet 22 is provided to transport circuit boards between the right handling station 14 and the coating station 12.

The shuttle 20 includes a frame 23 to which are pivotally mounted the pallets 21 and 22 in fixed spaced relationship with each other. The spacing is preferably equal to the distance between the centers of the coating station 12 and each of the handling stations 13 and 14. The frame 23 is provided with a plurality of mounting rollers 24 by which the shuttle 20 is supported on a track or pair of rails 25 that have roller receiving slots 26 on one side thereof. (See FIGS. 2A and 3.) The rollers 24 ride in the slots 26 for linear movement of the shuttle 20 on the frame 11. The pallets 21 and 22 are each equipped with a structure for holding a circuit board. In FIG. 2, a circuit board 27 is illustrated at the coating station 12 supported by the pallet 21 with the bottom side of the board 27 facing upwardly toward the spray device 19 (FIG. 1) for the application of coating material to the upwardly facing bottom surface of the circuit board 27. The pallet 22 is illustrated in FIG. 2 supporting a circuit board 28 with its top surface facing upwardly at the right handling station 14. At handling station 14, the board can be loaded onto, unloaded from and/or inverted on the right pallet 22 of the shuttle 20. Similarly, when the shuttle 20 is in its leftmost position, a circuit board 28 on the right pallet 22 will be in the coating chamber 12 for the application of a coating to its upwardly facing surface, while the circuit board 27 will be in the left handling station 13 where it can be loaded into, removed from and/or inverted on the pallet 21.

Figure 2A:
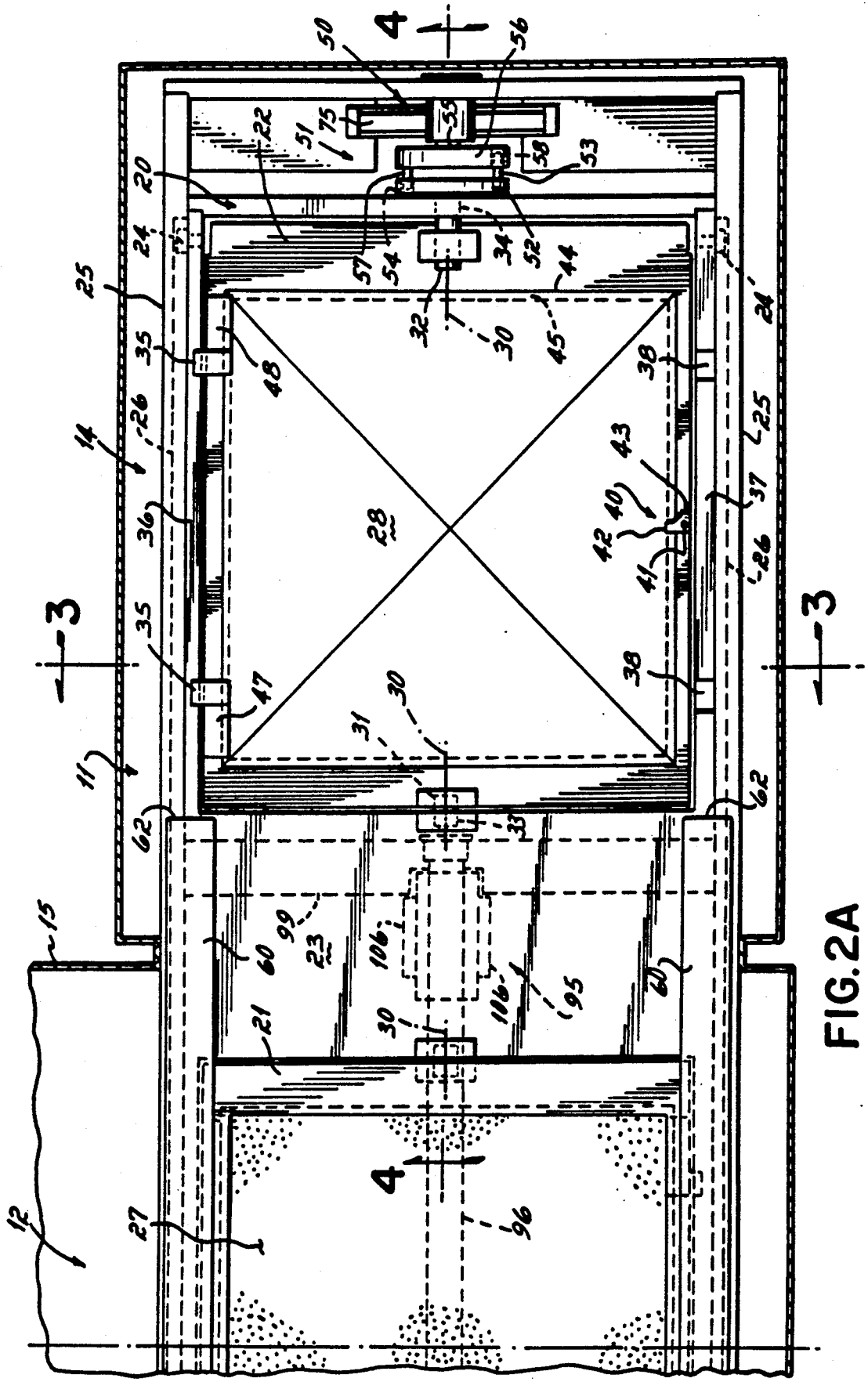
FIG. 2A is an enlargement of a portion of the top cross-sectional view of FIG. 2.

The structure of FIG. 2 is illustrated in greater detail in the enlarged drawing of FIG. 2A. The pallets 21 and 22 are identical and will be hereinafter described with reference to the pallet 22 at the right handling station 14 in FIGS. 2 and 2A. The parts described with respect to the pallet 22 and right handling station 14 are mirror images of otherwise identical parts of pallet 21 and handling station 13.

The pallet 22 is pivotally mounted to the shuttle frame 23 to rotate about an axis 30 which extends through the center of the handling station 14, the coating station 12, and the handling station 13. The pallet 22 pivots on a pair of aligned shafts 31 and 32 each rigidly mounted to the pallet 22. The shafts 31 and 32 are rotatably supported, respectively, in a pair of bearings 33 and 34 carried by the frame 23 of the shuttle 20 and lying on the axis 30. The pallet 22 has a pair of tabs or stops 35 rigidly fixed to and extending from one side of the pallet 22 to limit the rotatability of the pallet 22 on the shuttle 20. The stops 35 rest against a side ledge 36, which is part of the shuttle frame 23, when the top of the circuit board 28 is facing upwardly as in FIG. 2A, and rests against the opposite ledge 37 of the shuttle frame 23 when the circuit board 28 is inverted with its bottom side facing upwardly. When against the ledge 37, the tabs 35 fit into pairs notches or recesses 38 so as to permit full 180 degree rotation of the pallet 22 in the shuttle 20.

A pivotal latch 40 is secured to the shuttle 22 at pivot pin 41 to rotate thereabout in a 90° arc. As shown in FIG. 2A, the latch 40 has a tab 42 which, when the latch 40 is in the position shown in FIG. 2A, secures the circuit board 28 to the pallet 22. The circuit board 28 may be removed from or inserted into the pallet 22 by rotation of the latch 42 clockwise 90° from its position of FIG. 2A to move the locking tab 42 away from the circuit board 28. As the latch 40 is so rotated, a pallet locking tab 43, shown to the right of pin 41 in FIG. 2A, rotates down in the figure, toward the front of the apparatus 10, to overlie the ledge 37 and securely lock the pallet 22 against rotation when the circuit board 28 is being inserted into or removed from the pallet 22.

The circuit board 28 is preferably inserted into the pallet 22 by placing it face down in an opening 44, provided in the center of the pallet 22, and resting the peripheral edge of the circuit board 28 upon a recessed ledge 45 provided around the opening 44 of the pallet 22. This insertion is carried out with the tab 42 of the latch 40 moved to the right, clockwise from the position shown in FIG. 2A, as described above. As the board 28 is inserted into the pallet 22, its back edge is tucked beneath a pair of lips 47 and 48 on the back edge of the pallet 22 as shown in the top of FIG. 2A, towards the back of the machine 10. After the board 28 is inserted into the opening 44, the latch 40 is rotated 90° counterclockwise, to the position shown in FIG. 2A, to lock the board in place on the pallet 22 and release the pallet for rotation about axis 30.

The pallet 22, when in the handling station 14, is rotated between and held in either of two 180° orientations, one with the top side of the board facing upwardly and the other with the bottom side of the board facing upwardly. A pallet rotating mechanism 50, which is centered on the axis 30 at the outer end of the handling station 14 opposite from the coating chamber 12, rotates and holds the pallet between and in the two orientations when the pallet 22 is fully positioned in the handling station 14. The rotating mechanism 50 includes a rotary drive mechanism 51 mounted to the frame 11 at the outer end of the handling station 14 and a coupling element 52 on the outer or rightmost end of the shuttle 20 and fixed to the free end of the shaft 32.

The coupling element 52 has a fixed pin 53 mounted near its edge, and extending toward the drive mechanism 51 parallel to and spaced from the axis 30. On the coupling element 52, diametrically opposite the pin 53 and axially aligned therewith, is a pin receiving hole 54 which is also parallel to the axis 30. The drive mechanism 51 has a rotary output drive shaft 55, which lies on the axis 30 and extends from the drive mechanism 51 toward the shuttle 20. At the remote end of the shaft 55 toward the shuttle 20 is a rotary drive disk 56 having a drive pin 57 fixed to it near its outer edge. The pin 57 extends toward the shuttle 20 from the drive disk 56 parallel to the axis 30 and concentric and axially aligned with the hole 54 in the coupling element 52. The drive pin 57 drivably engages the coupling element 52 by insertion of the pin 57 into the hole 54 as the shuttle 20 moves toward and against the drive mechanism 51 as the shuttle 20 approaches its extreme rightmost position on the track 25. Similarly, the drive disk 56 has in it a hole 58 diametrically opposite the pin 57, parallel to and spaced from the axis 30, concentric and aligned with the pin 53 of the coupling element 52, to form a driving engagement with the pin 53 when the shuttle 20 is at its rightmost position.

Fixed to the rails or track 25 is a flange 60 which overlies the frame of the pallet 22 whenever the pallet is away from its rightmost position to lock the pallet against rotation as it is moved towards and positioned in the coating chamber 12. The flange 60 has a wear pad 61, best shown in FIG. 3, on its lower surface, which engages the pallet as the pallet is translated. The rightmost end 62 extends closer to the edge of the pallet 22, when the pallet is in its rightmost position, than the depth of the pins 57 and 53 in the holes 54, 58, to thereby prevent any rotation of the pallet after disengagement of a drive mechanism 51 by the coupling element 52 as the pallet moves to the left with the shuttle 20, away from its rightmost position.

Figure 3:
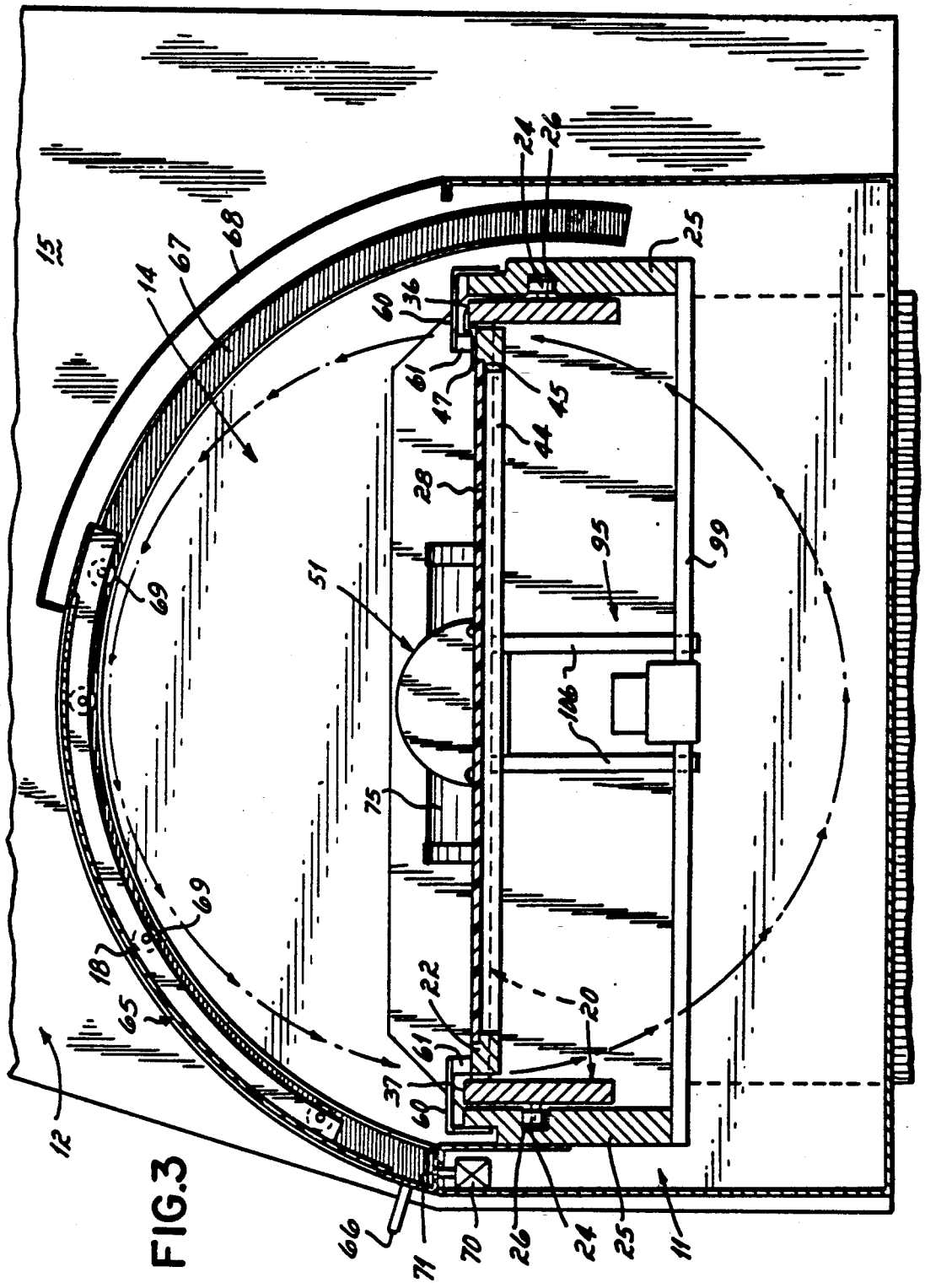
FIG. 3 is a side cross-sectional view taken along line 3—3 of FIG. 2A.

Referring to FIG. 3, the handling station 14, which is identical to the handling station 13 but a mirror image thereof, is provided with a semi-cylindrical transparent door 65 having at its front a handle 66. The door 65 shown in a closed position in FIG. 3, slides to an open position when lifted by an operator with the handle 66. The door 65 slides in semi-cylindrical channels 67 into the back of handling station 14, beneath a chamber cover 68 that overlies the back of the handling station 14. The door 65 slides in the channels 67 on a plurality of rollers 69 rotatably mounted to the edges of the door 65. At the front of the door 65 a door switch 70 is provided in the frame 11 at the bottom of the opening for the door 65. The switch 70 has an actuator positioned to engage the lower front edge 71 of the door 65 to provide an electrical signal to indicate that the door is closed. The switch 70 is connected with controls of the apparatus 10 so as to disable pallet inversion and shuttle movement when the door 65 is not fully closed.

The pallet inverting drive mechanism 51 is shown in greater detail in FIGS. 4 and 5. Referring to FIGS. 4 and 5, the pallet drive shaft 55 is fixed to a gear wheel 74 of a rotary drive device 75. The device 75 is a commercially available device such as part No. R11-H-4180-D-A-T manufactured by PHD Company of Ft. Wayne, Ind. The rotary drive device 75 includes a pair of parallel racks 76 and 77 movable linearly in opposite horizontal directions perpendicular to the axis 30 thereby providing rotating means for inverting the pallets 21 and 22. The teeth of the racks 76 and 77 are in driving engagement with the gear 74 to drive it in 180° rotation to invert the pallet to bring the top and bottom surfaces of a circuit board held in the pallet alternately into an upwardly facing orientation. The gear 74 is rotated 180° in one direction by the rack 76 and 180° in the other direction by the rack 77.

The rack 76 is driven in a direction to the left in FIG. 5 (toward the back of the apparatus 10 in FIGS. 1, 2 and 2A) by a pneumatic cylinder 78. The motion in this direction is damped by hydraulic fluid in a hydraulic cylinder 79 at the back end of the rack 76. The damping is achieved by a flow control valve 80 which restricts the flow of hydraulic fluid from the cylinder 79 into an oil reservoir 81, which, during the rearward movement of the rack 76 under the force of pneumatic piston 78 is maintained at ambient pressure through the control line 82, which is vented to atmosphere. The pressure to cylinder 78 is supplied by high pneumatic pressure applied at control line 83.

Simultaneous with the driving of the rack 76 rearwardly, the rack 77 is driven forwardly by hydraulic pressure from reservoir 84, which is pressurized from the control line 83, and through the check valve 85 into the hydraulic cylinder 86 at the rear end of the rack 77. As the rack 77 moves forward, a pneumatic cylinder 87, at the forward end of the rack 77, is vented to atmospheric pressure through the control line 82.

The rearmost position of the rack 76 is adjustable by a setting of a stop nut 88 at the rear end of the cylinder 79, to limit the end point of the 180° rotation. As the rack 76 approaches its rearmost position, the shock of an impact is eliminated by the provision of a cushion adjustment 89. This cushion adjustment may take any known form that determines the bleeding rate of the fluid from a cushion chamber 90 behind a stem 91 of piston 92 of the cylinder 79 at the rear end of the rack 76.

Similar structure and operation are provided with respect to the driving of the rack 77 to its rearward position through pneumatic pressure exerted at pneumatic cylinder 87. The force exerted through control line 82 moves the rack 77 rearwardly to drive the hydraulic cylinder 86 at the rear end of rack 77 to drive fluid at a controlled flow rate through flow control valve 93 to the reservoir 84, which is vented to atmospheric pressure at control line 83. Pneumatic pressure applied to the hydraulic fluid in the reservoir 81 is communicated through the check valve 94 into the hydraulic cylinder 79 at the rear of rack 76 to drive the rack 76 forwardly and move the piston of cylinder 78 forwardly as the cylinder 78 is vented to atmospheric pressure at the control line 83.

The movement of the shuttle 20 between a rightmost position at which the pallet 22 is in the handling chamber 14 with pallet 21 in the coating chamber 12, and the leftmost position at which the pallet 21 is in the handling chamber 13 with the pallet 22 in the coating station 12, is achieved by a shuttle drive mechanism 95 (FIGS. 2, 2A, 4 and 6), which is in the form of a linear actuator. The drive mechanism 95 includes a pneumatic cylinder 96 fixed at each end to a transverse frame member 99 secured to rails 25 of the frame 11. The cylinder 96 is double acting, and has a drive cable 97 connected to each side of its piston 111. The cable 97 extends around a set of pulleys 98 at the extreme right and left ends of the cylinder 96 and has each of its ends connected to each end of a shuttle drive block 100 having a roller 101 on each side thereof. Each roller 101 is rotatably captured in a slot 105 of a yoke 106 which depends from and is fixed to frame 23 of the shuttle 20. The drive mechanism 95 is a commercially available device such as model BC100 manufactured by The Tool-O-Matic Company of Minneapolis, Minn. The cylinder 96 of the mechanism 95 is driven to either the right or the left by pneumatic pressure applied through lines 107 or 108 (FIG. 6) and respectively communicated through flow check valves 109 and 110 to drive the double acting piston 111 to the right or to the left. When the piston 111 is moving to the right, pneumatic fluid is vented from the low pressure side of the piston back to line 108 through the flow control valve 112, which restricts the flow to control or limit the speed of the shuttle. Similarly, when the piston 111 of cylinder 96 is being driven in the opposite direction, fluid is vented from the low pressure side of the cylinder 96 to line 107 through flow control valve 113, which restricts fluid flow and limits the shuttle speed.

The preferred method performed by the illustrated embodiment of the present invention is depicted in the sequence of diagrams of FIGS. 7A-7H. Referring to FIG. 7A, there is illustrated a shuttle 20 in its extreme right position with an empty left pallet 21 in the coating station 12 and the right pallet 22 in the right handling station 14. Initially, both of the pallets 21 and 22 will be empty. Then, as represented by the arrow 120, circuit board 28 is inserted or loaded into the right pallet 22 with its top surface facing up.

Then, referring now to FIG. 7B, the right pallet 22 is rotated 180° as represented by the arrow 121 to bring the bottom surface of the circuit board 28 to the upwardly facing orientation. This initial inversion of the circuit boards is preferred so that the bottom surface is coated first, leaving the top surface of the circuit boards on which the circuit devices are installed to be coated last and face upwardly when the boards are removed. This allows the top surface of the board, which has a more complicated profile and thus thicker areas of coating, more time to dry. Then, as illustrated in FIG. 7C, the shuttle 20 is shifted to its leftmost position to bring the pallet 22 and circuit board 28 into the coating chamber of the coating station 12 as represented by the arrow 122. This motion simultaneously carries the pallet 21 into the left handling chamber 13.

At the left handling chamber 13, circuit board 27 is inserted or loaded into the pallet 21, as shown by arrow 123, with its top surface facing upwardly. While the board 27 is being inserted into the pallet 21, a coating operation is carried out on the upwardly facing bottom surface of the circuit board 28 at the coating station 12. While this coating operation is being carried out, the circuit board 27 in the pallet 21 is also inverted by rotation of the pallet 21 180° as represented by the arrow 124 in FIG. 7D. This rotation brings the bottom surface of the circuit board 27 into an upwardly facing orientation. Then, when the coating operation at station 12 is complete on the bottom surface of the circuit board 28, the shuttle 20 is again shifted back to its rightmost position as illustrated by the arrow 125 in FIG. 7E. The position shown in FIG. 7E is that illustrated in the drawings of FIGS. 2 and 2A.

When in its rightmost position, the pallet 22 is rotated, this time in the opposite direction as shown by arrow 126, through 180° to bring the top surface of the circuit board 28 into an upwardly facing orientation. During this rotation of the pallet 22, a coating operation at the coating station 12 is performed on the upwardly facing bottom surface of the circuit board 27 held in the pallet 21. Then, as illustrated in FIG. 7F, the shuttle 20 is again shifted to its leftmost position as illustrated by the arrow 127 in FIG. 7F.

When in the leftmost position, the pallet 21 is again inverted, this time by rotation 180° in the opposite direction as it was previously rotated, as represented by the arrow 128, to bring the top surface of the circuit board 27 into an upwardly facing orientation. During this rotation of the pallet 21, a coating operation is performed at the coating station 12 on the upwardly facing top surface of the circuit board 28 held in the pallet 22. Then, referring to FIG. 7G, the shuttle 20 is again shifted to its rightmost position, as represented by the arrow 129, to bring the pallet 21 to the coating station 12 and the pallet 22 to the right handling station 14.

At the coating station 12, the upwardly facing top surface of the circuit board 27 is coated while the circuit board 28 is removed at the handling station 14 from the pallet 22 as represented by the arrow 130. Then, another circuit board 28a is inserted into the right pallet 22 at the handling station 14, as represented by the arrow 131, with its top surface facing up, then inverted to bring its bottom surface into an upwardly facing orientation by 180° rotation of the pallet 22 as represented by the arrow 132 in FIG. 7G. Then, the shuttle 20 is shifted to its leftmost position again, as shown by arrow 133 in FIG. 7H, to bring the pallet 22 carrying the circuit board 28a into the coating station 12 with its bottom surface in an upwardly facing orientation whereupon it is coated from above.

The shifting brings again the pallet 21 to the left handling station 13 wherein the circuit board 27 is unloaded therefrom, as represented by the arrow 134 of FIG. 7H, and another circuit board 27a is inserted or loaded into the pallet 21 with its top surface facing up as represented by the arrow 135. The pallet 21 is then rotated through 180° as illustrated by arrow 136 to bring the bottom surface of the circuit board 27a into an upwardly facing orientation. The unloading of the circuit board 27, the loading of the circuit board 27a and the inversion of the circuit board 27a at the handling station 13 occurs while the coating operation is being performed on the upwardly facing bottom surface of the circuit board 28a in pallet 22 at the coating station 12. Then, the shuttle 20 is again shifted to its rightmost position, as illustrated in FIG. 7E, and the sequence of operation continues as described in connection with FIGS. 7E-7H above.

As can be seen from the sequence of operation of FIGS. 7A-7H, a coating operation can be performed at a single coating station 12 with a coating dispensing device positioned on one side of the shuttle 20 so as to coat circuit boards at the coating station 12 from a single direction, namely, from above in the illustrated embodiment, while loading, unloading and inversion of the circuit boards to be coated takes place at the two handling stations 13 and 14, for maximum efficiency.

It will be appreciated by those skilled in the art that many variations and alternatives to the specific embodiments illustrated may be provided without departure from the principles of the present invention. Accordingly, it is intended that the scope of this patent be limited only by the following claims:

We claim:

1. An apparatus for coating both sides of a two-sided circuit board, comprising:
   a frame;
   a coating station supported on the frame and having at least one coating dispensing device thereat;
   at least one handling station positioned on the frame spaced from the coating station;
   a shuttle mounted on the frame and having at least two pallets rotatably mounted thereon, the shuttle being moveable to a plurality of positions, each to bring at least one of the pallets to the coating station;
   the pallets being spaced on the shuttle such that, when one of the pallets is at the coating station, another of the pallets is at a handling station;
   each of the pallets having means for supporting at least one circuit board thereon with one side thereof in a coating orientation facing the at least one dispensing device when at the coating station; and
   the pallets each being independently rotatable, when at a handling station, to alternately bring either one of the opposite sides of a circuit board held thereon to the coating orientation.

2. The apparatus of claim 1 wherein:
   each of the pallets has means thereon for releasably engaging a circuit board, when at a handling station, to permit the loading and unloading of the circuit board therefrom.

3. The apparatus of claim 1 wherein:
   the plurality of positions of the shuttle lie in a horizontal plane, and the movement of the shuttle is in a path extending between the coating station and the least one handling station in the horizontal plane; and
   each dispensing device is located above the path and oriented so as to dispense coating material downwardly upon the upwardly facing side of a circuit board in the path.

4. The apparatus of claim 1 further comprising:
   means for separately rotating each of the pallets, when at a handling station through 180 degrees to invert a circuit board supported thereon to bring the opposite sides thereof alternately into an orientation that will face the at least one dispensing device when at the coating station.

5. The apparatus of claim 4 wherein the rotating means includes:
   a coupling element on each pallet; and
   a rotary drive mechanism at each handling station;
   the drive mechanisms being engageable with the coupling element of a pallet as the pallet is moved into the handling station, to permit the rotation thereof by the rotating means.

6. The apparatus of claim 5 further comprising:
   means for locking one of the pallets against rotation with one side of a circuit board held thereby facing upwardly in an orientation that will face the at least one dispensing device when said one pallet is at the coating station while the coupling element of another pallet is engaged by the drive mechanisms.

7. The apparatus of claim 1 further comprising:
   means for independently locking each of the pallets against rotation as a circuit board is being loaded thereonto or unloaded therefrom.

8. The apparatus of claim 7 wherein:
   the locking means includes means on each of the pallets for releasably engaging a circuit board, when at a handling station, to permit the loading and unloading of the circuit board therefrom; and
   each of the engaging means includes means for releasing a circuit board held thereby when the respective pallet is locked against rotation.

9. The apparatus of claim 8 wherein:
   each of the handling stations has a door positioned thereat moveable between an open and a closed position, and
   each handling station has means located thereat for preventing the rotation of the pallet thereat when the door thereat is in its open position.

10. The apparatus of claim i wherein:
    the number of handling stations is at least two and the shuttle is moveable to move each pallet between the coating station and a different respective one of the handling stations.

11. The apparatus of claim 10 wherein:
    the number of pallets is two: and
    the number of handling stations is two, and the two handling stations are positioned on the frame on opposite sides of the coating station, the shuttle being moveable in a linear path extending between the handling stations and through the coating station.

12. An apparatus for coating both sides of a two-sided circuit board, comprising:
a frame;
a coating station supported on the frame;
two circuit board handling stations, including a right and a left handling station, positioned on the frame on opposite sides of the coating station;
a linear track extending between the right and left handling stations and through the coating station;
a shuttle slidably mounted on the track and moveable between a left position and a right position;
means on the frame for driving the shuttle between its left and its right position;
two pallets, including a left pallet and a right pallet, each rotatably mounted on the shuttle;
each of the pallets having a circuit board holder carried thereon, each holder having means for supporting at least one circuit board on the pallet;
a coating material dispensing device located at the coating station and supported on the frame above the track and having a coating material discharge port directed toward the track to coat an upwardly facing side of a circuit board supported in a pallet positioned thereat;
the pallets being spaced on the shuttle and the stations being spaced on the frame such that, when the shuttle is in the left position, the left pallet is positioned at the left handling station and the right pallet is positioned at the coating station, and, when the shuttle is in the right position, the left pallet is positioned at the coating station and the right pallet is positioned at the right handling station;
the pallets each being independently rotatable through an angle of at least 180 degrees about a horizontal axis to alternately bring one of the opposite sides of a circuit board held thereby to an upwardly facing orientation;
means for separately rotating each of the pallets, when at a handling station, 180 degrees about the axis, so as to invert a circuit board supported thereon to bring the opposite side thereof into an upwardly facing orientation;
each of the holders having means thereon for releasably engaging a circuit board, when at a handling station, to permit the loading and unloading of the circuit board therefrom; and
the coating material dispensing device being operable to coat the upwardly facing side of a circuit board supported on a pallet at the coating station while another circuit board held by the other pallet is being inverted, loaded and/or unloaded at a handling station.

13. The apparatus of claim 12 wherein the rotating means includes:
a pair of coupling elements, one on each pallet at each end of the shuttle; and
a pair of rotary drive mechanisms, one at each end of the track;
the drive mechanisms being alternately engageable, each with a respective one of the coupling elements, as the shuttle is moved to bring the respective pallet into the respective handling station, to permit the rotation of the respective pallet by the rotating means, while the other drive mechanism is disengaged.

14. The apparatus of claim 13 wherein:
the rotating means includes a rack and gear mechanism connected between the shuttle and each of the pallets for inverting a circuit board supported thereon.

15. The apparatus of claim 13 further comprising:
means for locking one of the pallets against rotation with one side of the circuit board held thereby facing upwardly, when the coupling element of the other pallet is engaged by one of the drive mechanisms.

16. The apparatus of claim 15 wherein:
each of the holders has means thereon for releasing a circuit board held thereby when the respective pallet is locked against rotation.

17. The apparatus of claim 12 further comprising:
a linear actuator connected between the frame and the shuttle for moving the shuttle between its left and right positions.

18. The apparatus of claim 12 further comprising:
means for separately locking each of the pallets against rotation as a circuit board is being loaded thereonto or unloaded therefrom.

19. The apparatus of claim 12 wherein:
each of the handling stations has a door positioned thereover moveable between an open and a closed position, and, means for disabling the rotating means from rotating a pallet thereat when the door is in its open position.

20. The apparatus of claim 12 wherein:
the coating material is a liquid coating material and the coating material dispensing device is a liquid coating material dispensing device.

* * * * *